(12) United States Patent
Kimura et al.

(10) Patent No.: US 9,306,578 B2
(45) Date of Patent: Apr. 5, 2016

(54) OSCILLATOR

(71) Applicant: NIHON DEMPA KOGYO CO., LTD., Tokyo (JP)

(72) Inventors: Hiroki Kimura, Saitama (JP); Naoki Onishi, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 14/571,304

(22) Filed: Dec. 16, 2014

(65) Prior Publication Data

US 2015/0171872 A1 Jun. 18, 2015

(30) Foreign Application Priority Data

Dec. 18, 2013 (JP) .................. 2013-260820
Sep. 3, 2014 (JP) .................. 2014-178740

(51) Int. Cl.
*H03L 1/04* (2006.01)
*H03B 5/36* (2006.01)

(52) U.S. Cl.
CPC ........ *H03L 1/04* (2013.01); *H03B 5/362* (2013.01); *H03B 5/368* (2013.01)

(58) Field of Classification Search
CPC .................................. H03L 1/04; H03B 5/08
USPC ..................... 331/154, 158, 69, 70
See application file for complete search history.

(56) References Cited

U.S. PATENT DOCUMENTS

| | | | |
|---|---|---|---|
| 5,319,324 A * | 6/1994 | Satoh et al. | 331/158 |
| 2005/0184819 A1 * | 8/2005 | Oita et al. | 331/158 |
| 2009/0174488 A1 * | 7/2009 | Inouchi et al. | 331/77 |

FOREIGN PATENT DOCUMENTS

| | | |
|---|---|---|
| JP | 01-248807 | 10/1989 |
| JP | 2004-304768 | 10/2004 |
| JP | 2007-013651 | 1/2007 |

* cited by examiner

*Primary Examiner* — Joseph Chang
*Assistant Examiner* — Jeffrey Shin
(74) *Attorney, Agent, or Firm* — Jiang Chyun Intellectual Property Office

(57) ABSTRACT

An oscillator includes an oscillator circuit, a crystal filter, a package portion, and a heating portion. The oscillator circuit is configured to output an oscillation signal. The crystal filter has a frequency characteristic where an attenuation at a detuned frequency is larger than an attenuation at an oscillation frequency of the oscillation signal. The detuned frequency is a frequency different from the oscillation frequency. The package portion covers a crystal blank of the oscillator circuit and a crystal blank of the crystal filter. The heating portion is configured to heat the crystal blank of the oscillator circuit and the crystal blank of the crystal filter using a resistor disposed between: a wiring board to which the package portion is secured, and the package portion.

8 Claims, 13 Drawing Sheets

OSCILLATOR

CROSS-REFERENCE TO RELATED APPLICATIONS

This application claims the priority benefit of Japanese application serial no. 2013-260820, filed on Dec. 18, 2013, and no. 2014-178740, filed on Sep. 3, 2014. The entirety of each of the above-mentioned patent applications is hereby incorporated by reference herein and made a part of specification.

TECHNICAL FIELD

This disclosure relates to an oscillator. In particular, this disclosure relates to an oscillator that removes an unnecessary noise component output from an oscillator circuit using a crystal filter for output.

DESCRIPTION OF THE RELATED ART

To support an accurate operation of electronic equipment, the electronic equipment employs a timing device that continues to supply a stable oscillation signal with a constant period. As this timing device, there is known a timing device that employs a crystal unit since early times. This timing device is widespread as a crystal oscillator. By disposing the filter that removes the unnecessary noise component output from the oscillator circuit in the crystal oscillator, the noise characteristic of the oscillation signal can be improved.

Here, FIG. 8 illustrates an example of a typical crystal oscillator. A crystal oscillator 100 causes an amplifier circuit 103 to amplify the oscillation signal obtained by oscillating a crystal unit 101a of an oscillator circuit 101, so as to output the oscillation signal. At this time, since the oscillator circuit 101 outputs the oscillation signal and an unnecessary noise component, a crystal filter 102 constituted of a crystal unit 102a is used to remove the unnecessary noise component. The crystal unit 101a of the oscillator circuit 101 is covered with a package P. FIG. 9 illustrates the comparative example between the phase noise characteristic of a crystal oscillator without the crystal filter and the phase noise characteristic of a crystal oscillator with the crystal filter. In FIG. 9, the vertical axis denotes phase noise and the horizontal axis denotes a detuning range (detuned frequency) from the center value of the oscillation frequency of the oscillation signal. As illustrated in FIG. 9, by disposing the crystal filter, a low noise that is realized in a detuned frequency band apart from several kHz from the oscillation frequency can be confirmed.

Now, since the crystal unit has a predetermined frequency/temperature characteristic, the frequency of the oscillation signal output from the crystal oscillator differs depending on the ambient temperature of the crystal unit. Therefore, as illustrated in FIG. 8, a heater circuit 104 is disposed in the crystal oscillator 100. There is known a temperature-controlled crystal oscillator (what is called an oven controlled crystal oscillator (OCXO)) that keeps a constant ambient temperature of the crystal unit 101a (more specifically, a crystal element (crystal blank) constituting the crystal unit 101a) of the oscillator circuit 101 by using a heat generating portion 104a of this heater circuit 104 (for example, referring to Japanese Unexamined Patent Application Publication No. 2007-13651 and Japanese Unexamined Patent Application Publication No. H01-248807). This oven controlled crystal oscillator allows stably outputting a constant frequency without being affected by the temperature of the external air.

The above-described oven controlled crystal oscillator improves the stability by keeping a constant temperature of the crystal unit that outputs the oscillation signal, but has room for further improvement. That is, the above-described oven controlled crystal oscillator focuses only on the temperature characteristic of the crystal blank used in the oscillator circuit, but does not take into consideration the temperature characteristic of the crystal blank used in the crystal filter.

Here, FIG. 10 illustrates the temperature characteristic of the crystal filter. In FIG. 10, the vertical axis denotes attenuation and the horizontal axis denotes a frequency. As illustrated in FIG. 10, in the crystal filter, the center frequency of the attenuation characteristic is shifted by a change in ambient temperature. As a result, the attenuation of a specific frequency differs depending on the ambient temperature of the crystal filter. Specifically, in the crystal filter at high temperature, the attenuation of a frequency apart from the center frequency −2 kHz in the drawing is larger than the attenuation of the center frequency (with an attenuation of 5 dB) by 5 dB. In contrast, in the crystal filter at low temperature, the attenuation of the frequency apart from the center frequency in the drawing by −2 kHz is the same as the attenuation of the center frequency. Accordingly, the crystal filter at low temperature cannot appropriately remove the signal of the frequency −2 kHz apart.

Thus, since the attenuation characteristic of the crystal filter differs depending on the ambient temperature, a system for appropriately controlling the ambient temperature of the crystal filter is required for improving the noise characteristic of the signal output from the crystal oscillator.

A need thus exists for an oscillator which is not susceptible to the drawback mentioned above.

SUMMARY

In a first aspect of this disclosure, there is provided an oscillator that includes an oscillator circuit, a crystal filter, a package portion, and a heating portion. The oscillator circuit is configured to output an oscillation signal. The crystal filter has a frequency characteristic where an attenuation at a detuned frequency is larger than an attenuation at an oscillation frequency of the oscillation signal. The detuned frequency is a frequency different from the oscillation frequency. The package portion covers a crystal blank of the oscillator circuit and a crystal blank of the crystal filter. The heating portion is configured to heat the crystal blank of the oscillator circuit and the crystal blank of the crystal filter by using a resistor disposed between a wiring board to which the package portion is secured, and the package portion.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

First Embodiment

Figure 1:
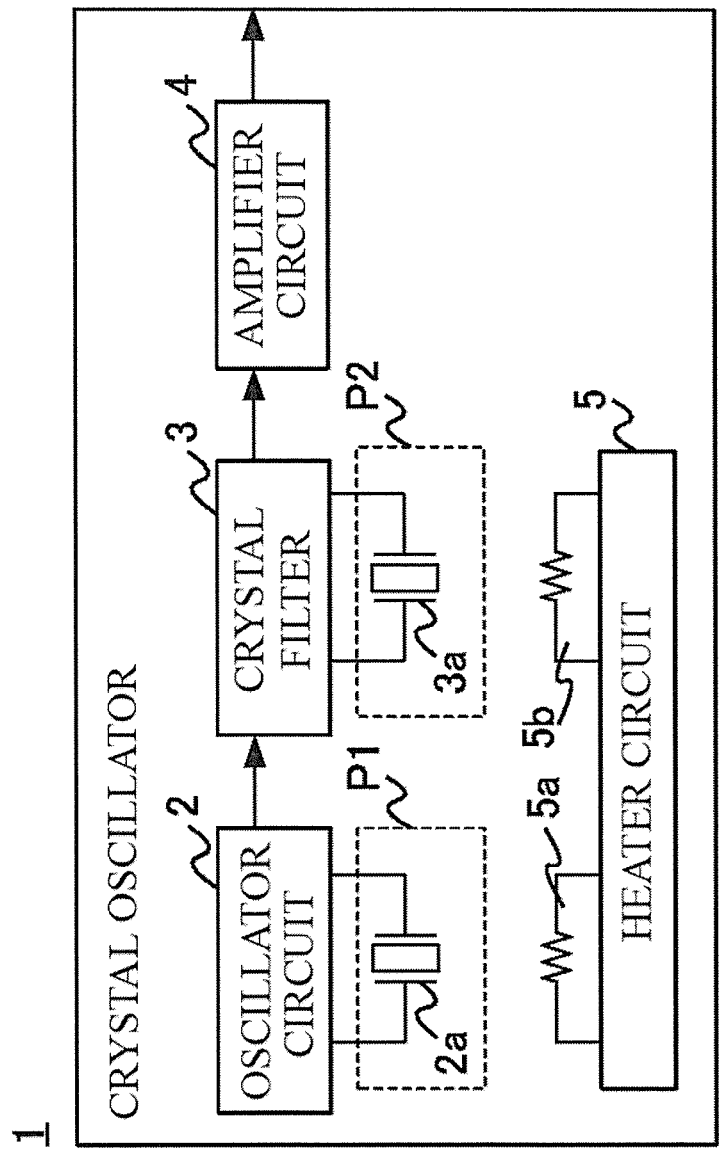
FIG. 1 is a function configuration diagram of a crystal oscillator according to a first embodiment.
Figure 2:
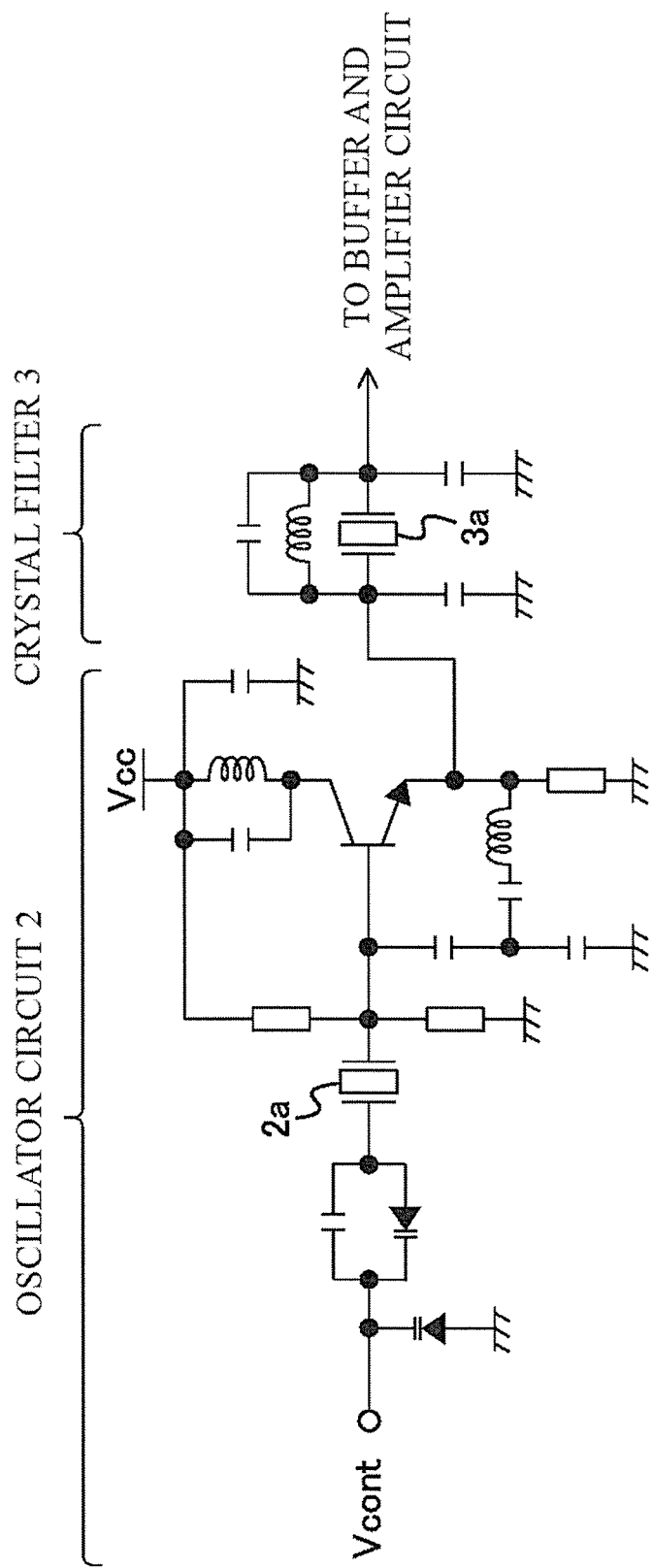
FIG. 2 is a circuit configuration diagram of an oscillator circuit and a crystal filter in the crystal oscillator.
Figure 3:
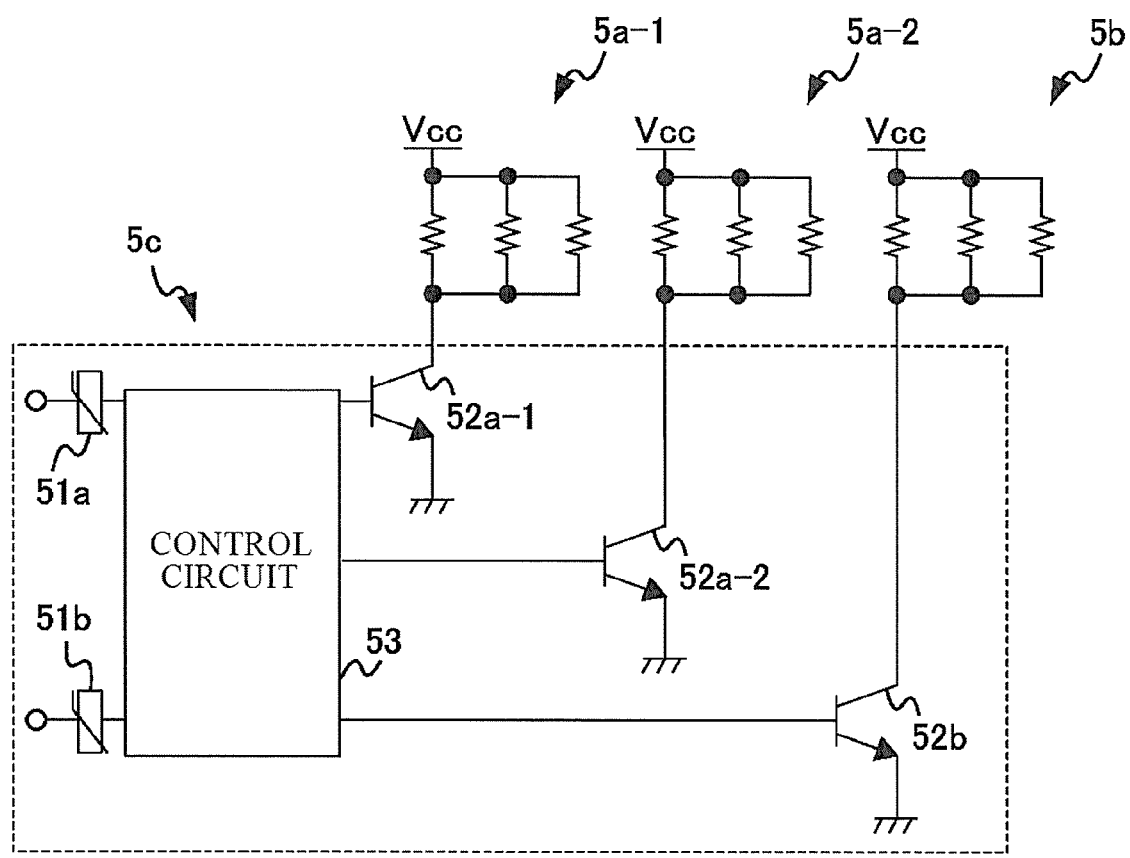
FIG. 3 is a circuit configuration diagram of a heater circuit of the crystal oscillator.

FIG. 1 is a function configuration diagram of a crystal oscillator 1 according to this embodiment. FIG. 2 is a circuit configuration diagram of an oscillator circuit 2 and a crystal filter 3 in the crystal oscillator 1. FIG. 3 is a circuit configuration diagram of a heater circuit 5 of the crystal oscillator 1. As illustrated in FIG. 1, the crystal oscillator 1 includes the oscillator circuit 2, the crystal filter 3, an amplifier circuit 4, and the heater circuit 5 as a heating portion.

As illustrated in FIG. 1 and FIG. 2, the oscillator circuit 2 and the crystal filter 3 have respective crystal blank (crystal element) 2a and crystal blank 3a. The oscillator circuit 2 oscillates the crystal blank 2a to output an oscillation signal. The crystal filter 3 removes an unnecessary noise component that is output from the oscillator circuit 2 together with the oscillation signal. That is, the crystal filter 3 has a frequency characteristic where the attenuation at a detuned frequency, which is a frequency different from the oscillation frequency of the oscillation signal, is larger than the attenuation at the oscillation frequency. The amplifier circuit 4 amplifies the oscillation signal obtained through the crystal filter 3 and outputs the oscillation signal.

The heater circuit 5 heats the crystal blank 2a of the oscillator circuit 2 and the crystal blank 3a of the crystal filter 3. As illustrated in FIG. 1 and FIG. 3, this heater circuit 5 includes heat generating portions 5a-1, 5a-2, and 5b (hereinafter, the heat generating portions 5a-1 and 5a-2 are collectively referred to as "the heat generating portion 5a" in some cases), which generate heat, and an adjustment portion 5c. The adjustment portion 5c controls the ambient temperatures of the crystal blanks 2a and 3a corresponding to the heat generations of the heat generating portions 5a and 5b.

The heat generating portions 5a and 5b are, for example, heating resistors and generate heat corresponding to flows of current due to supply of DC voltage. The adjustment portion 5c is constituted of, for example, a thermistor 51a, a thermistor 51b, transistors 52a-1 and 52a-2 (hereinafter collectively referred to as "the transistor 52a" in some cases), a transistor 52b, and a control circuit 53. The thermistor 51a functions as a temperature sensor that measures the ambient temperature of the crystal blank 2a. The thermistor 51b functions as a temperature sensor that measures the ambient temperature of the crystal blank 3a. The transistors 52a-1 and 52a-2 control the amount of current flowing through the heat generating portion 5a based on the ambient temperature measured by the thermistor 51a. The transistor 52b controls the amount of current flowing through the heat generating portion 5b based on the ambient temperature measured by the thermistor 51b. The control circuit 53 controls the transistor 52a and the transistor 52b. The transistor 52a and the transistor 52b also function as a heating portion itself together with the heat generating portions 5a and 5b.

The adjustment portion 5c controls the amount of currents flowing through the heat generating portions 5a and 5b such that the output voltages of the thermistors 51a and 51b coincide with the reference voltage corresponding to a target temperature, so as to keep constant ambient temperatures of the crystal blanks 2a and 3a as heating objects. The target temperature only needs to be the temperature at which the crystal blanks 2a and 3a stably operate, and may be in common between the crystal blank 2a of the oscillator circuit 2 and the crystal blank 3a of the crystal filter 3 or may be set separately. However, in the case where the separate target temperatures are set, the respective target temperatures affect each other and it is necessary to perform a control taking into consideration a temperature distribution. Accordingly, it is preferred to set the same target temperature.

The target temperature is preferred to be set corresponding to the cut of the crystal blank. In the case of an AT-cut crystal blank, the temperature around the peak of the downward convex curve where minimum frequency/temperature characteristics are provided is set to the target temperature. In the case of an SC-cut crystal blank, the temperature around the peak of the upward convex curve where maximum frequency/temperature characteristics are provided is set to the target temperature. Here, in this embodiment, the target temperature is in common between the crystal blanks 2a and 3a, and the temperature is set to 80° C.

Here, a temperature change affects more the oscillator circuit 2, which controls the frequency stability, than the attenuation characteristic of the crystal filter 3. Accordingly, to improve the noise characteristic of the signal output from the crystal oscillator 1, it is necessary to accurately perform the temperature management of the crystal blank 2a of the oscillator circuit 2. On the other hand, the temperature management of the crystal blank 3a of the crystal filter 3 does not need accuracy at that level.

Therefore, in the crystal oscillator 1, the control on the heat generating portion 5a used for heating the crystal blank 2a is performed more strictly than the control on the heat generating portion 5b used for heating the crystal blank 3a. That is, the adjustment portion 5c controls the heat generation amount of the heat generating portion 5a such that the ambient temperature of the crystal blank 2a is within a first range from the target temperature for the crystal blank 2a while controlling the heat generation amount of the heat generating portion 5b such that the ambient temperature of the crystal blank 3a is within a second range, which is wider than the first range, from the target temperature for the crystal blank 3a. Specifically, three heating resistors are set to one transistor. Two sets of the transistor and the heating resistors (see the heat generating portions 5a-1 and 5a-2 in FIG. 3) are used for the crystal blank 2a of the oscillator circuit 2, and one set of the transistor and the heating resistors (see the heat generating portion 5b in FIG. 3) is used for the crystal blank 3a of the crystal filter 3. This realizes high-accurate temperature management on the crystal blank 2a.

Figure 4A:
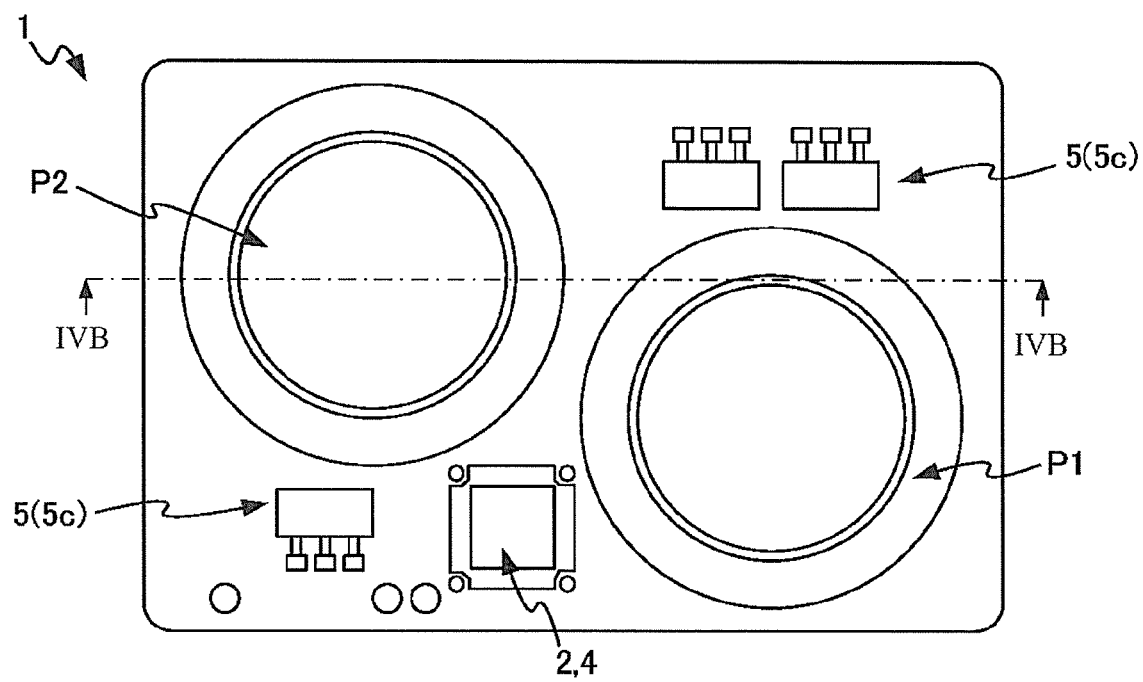
FIG. 4A is a top view illustrating the external appearance of the crystal oscillator.
Figure 4B:
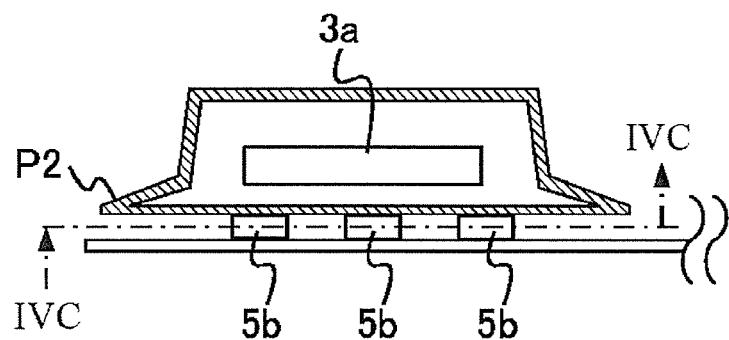
FIG. 4B is a cross-sectional view illustrating a part of the cross section taken along the line IVB-IVB in FIG. 4A.
Figure 4C:
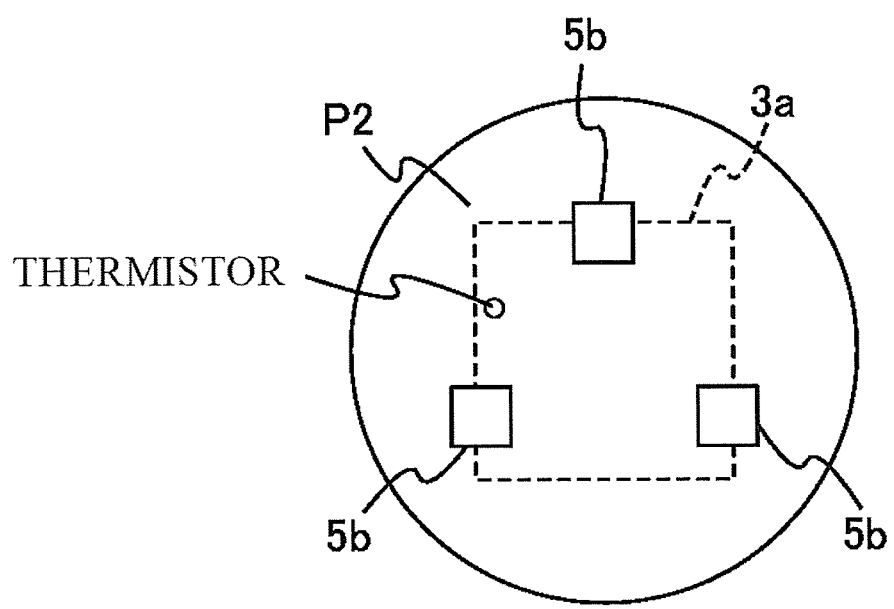
FIG. 4C is a cross-sectional view illustrating the cross section taken along the line IVC-IVC in FIG. 4B.

The function configuration and the circuit configuration of the crystal oscillator 1 have been described above. Subsequently, a description will be given of a specific example of the arrangement of the crystal oscillator 1 according to this embodiment with reference to FIG. 4A, FIG. 4B, and FIG. 4C. FIG. 4A is a top view illustrating the external appearance of the crystal oscillator 1 in a state where the case is removed. FIG. 4B is a cross-sectional view illustrating a part of the cross section taken along the line IVB-IVB in FIG. 4A. FIG. 4C is a cross-sectional view illustrating the cross section taken along the line IVC-IVC in FIG. 4B.

As illustrated in FIG. 4A, the crystal oscillator 1 is constituted such that the oscillator circuit 2, the crystal filter 3, the amplifier circuit 4, and the heater circuit 5 are disposed on a wiring board. On the wiring board, packages P1 and P2 molded of metal are mounted. Between the wiring board and the packages P1 and P2, thermal conductive sheets or bases made of aluminum may be disposed. Inside of the package P1, the crystal blank 2a of the oscillator circuit 2 is arranged. Inside of the package P2, the crystal blank 3a of the crystal filter 3 is arranged. Here, the packages P1 and P2 housing the crystal blank 2a and the crystal blank 3a correspond to crystal units.

As described above, the crystal blank 3a of the crystal filter 3 employs the three heating resistors (the heat generating portion 5b). Accordingly, as illustrated in FIG. 4B and FIG. 4C, the three heating resistors are equally arranged under the package P2 on the wiring board (that is, between the wiring board, to which the package P2 is secured, and the package P2). The inside of the package P2 (that is, the crystal blank 3a) is heated by conduction of heat generated by the three heating resistors. In the vicinity of the heat generating portion 5b, the thermistor 51b constituting the adjustment portion 5c is disposed to measure the ambient temperature of the crystal blank 3a. Here, the package P1 is different only in that the six heating resistors (the heat generating portion 5a) are used for the crystal blank 2a. Therefore, the illustration and the detailed description are omitted.

The crystal oscillator 1 according to the first embodiment has been described above. With the crystal oscillator 1 according to the first embodiment, the following effects are expected.

In the crystal oscillator 1, the temperature control corresponding to the frequency/temperature characteristics is performed not only on the crystal blank 2a of the oscillator circuit 2 but also on the crystal blank 3a of the crystal filter 3. That is, in the crystal oscillator 1, the crystal blank 3a of the crystal filter 3 is heated by the heat generating portion 5b. In particular, in the crystal oscillator 1, the heat generating portions 5a and 5b are constituted of the heating resistors and the control circuit 53 controls the currents flowing through the heat generating portions 5a and 5b. This allows improving the accuracy of the temperature control. This allows keeping an approximately constant ambient temperature of the crystal blank 3a. Thus, the center frequency of the attenuation characteristic of the crystal filter 3 can coincide with the frequency of the oscillation signal, and the unnecessary noise component can appropriately be removed. As a result, the noise characteristic of the signal output from the crystal oscillator 1 can be improved.

In the crystal oscillator 1, the crystal blank 2a of the oscillator circuit 2 and the crystal blank 3a of the crystal filter 3 are covered with the separate packages P1 and P2. This allows performing individual temperature controls corresponding to the respective crystal blanks 2a and 3a. That is, in the crystal oscillator 1, the heat generating portion 5a is controlled such that the ambient temperature of the crystal blank 2a of the oscillator circuit 2 is within the first range from the target temperature. Additionally, the heat generating portion 5b is controlled such that the ambient temperature of the crystal blank 3a of the crystal filter 3 is within the second range, which is wider than the first range, from the target temperature. This allows accurately controlling the ambient temperature of the crystal blank 2a of the oscillator circuit 2 which requires strict temperature management, thus improving the frequency stability of the signal output from the crystal oscillator 1.

Second Embodiment

Next, a description will be given of a crystal oscillator 1A according to a second embodiment. In the crystal oscillator 1 according to the first embodiment, the crystal blank 2a of the oscillator circuit 2 and the crystal blank 3a of the crystal filter 3 are covered with the separate packages P1 and P2. On the other hand, in the crystal oscillator 1A according to the second embodiment, the crystal blank 2a of the oscillator circuit 2 and the crystal blank 3a of the crystal filter 3 are covered with a package P3 in common. Here, in the following description, like reference numerals designate corresponding or identical elements throughout the first embodiment and the second embodiment, and therefore such elements will not be further elaborated here.

Figure 5:
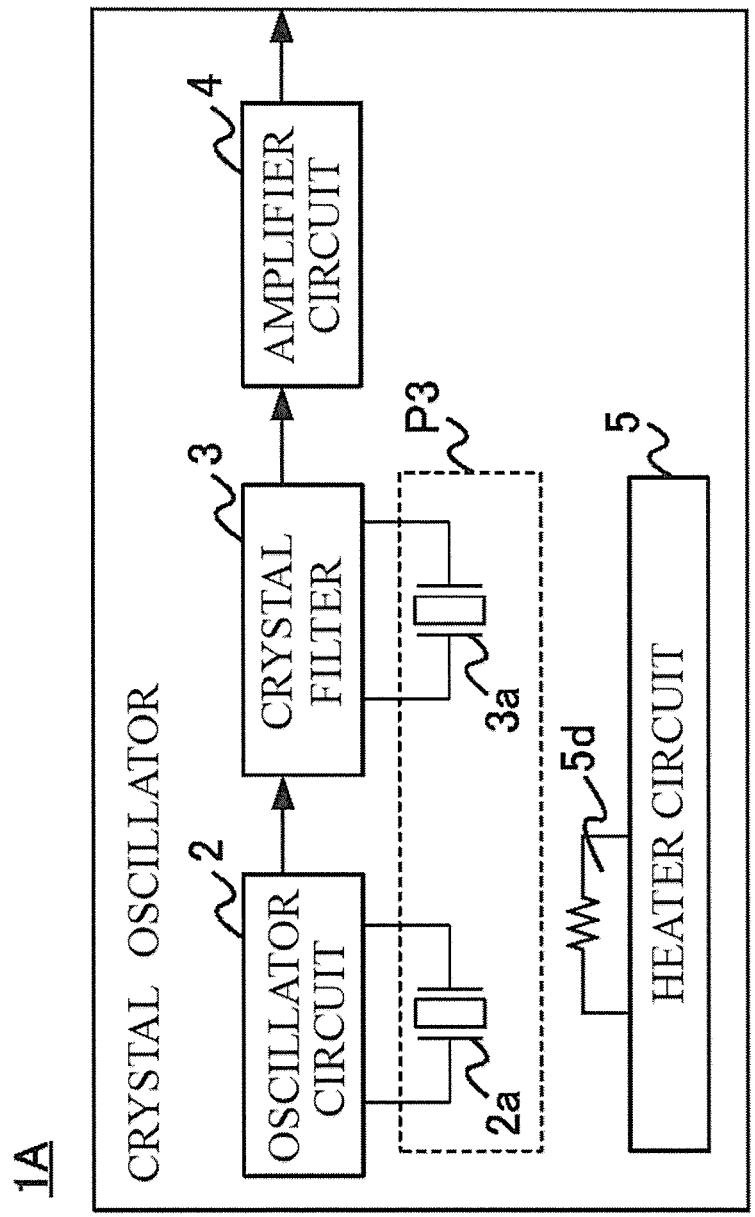
FIG. 5 is a function configuration diagram of a crystal oscillator according to a second embodiment.

FIG. 5 is a function configuration diagram of the crystal oscillator 1A according to the second embodiment. The crystal oscillator 1A includes the oscillator circuit 2, the crystal filter 3, the amplifier circuit 4, and the heater circuit 5. The crystal blank 2a of the oscillator circuit 2 and the crystal blank 3a of the crystal filter 3 are covered with the package P3. This allows keeping an approximately constant temperature inside of the package P3, that is, an approximately constant ambient temperature of the crystal blanks 2a and 3a.

Specifically, the adjustment portion 5c of the heater circuit 5 controls the amount of current flowing through a heat generating portion 5d such that the output voltage of the thermistor coincides with the reference voltage corresponding to the target temperature, so as to set the ambient temperature of the crystal blanks 2a and 3a as the heating objects within a predetermined range from the target temperature.

Here, the target temperature in the second embodiment is the temperature at which both the crystal blank 2a of the oscillator circuit 2 and the crystal blank 3a of the crystal filter 3 operate stably. As described above, between the crystal blank 2a of the oscillator circuit 2 and the crystal blank 3a of the crystal filter 3, the crystal blank 2a of the oscillator circuit 2 requires more strict temperature management. Therefore, the thermistor or similar member for measuring the ambient temperature of the crystal blanks 2a and 3a may be arranged in the vicinity of the crystal blank 2a rather than the crystal blank 3a. The two sets of the transistor and the heating resistors as the heat generating portion 5d may be used to realize high-accurate temperature management on the crystal blank 2a. At this time, the heating resistors may be arranged to have equal distances from the crystal blank 2a.

The crystal oscillator 1A according to the second embodiment has been described above. With the crystal oscillator 1A according to the second embodiment, the following effects are expected.

In the crystal oscillator 1A, the crystal blank 2a of the oscillator circuit 2 and the crystal blank 3a of the crystal filter 3 are cover with the package P3 in common and are heated using the heat generating portion 5d. Accordingly, the temperature control corresponding to the frequency/temperature characteristics can be performed not only on the crystal blank 2a of the oscillator circuit 2 but also on the crystal blank 3a of the crystal filter 3. Thus, the noise characteristic of the signal output from the crystal oscillator 1A can be improved. Additionally, it is not necessary to arrange a plurality of packages on the wiring board. Thus, the crystal oscillator 1A can be downsized.

In the crystal oscillator 1A, the heat generating portion 5d is controlled such that both the crystal blanks 2a and 3a are in the predetermined range from the target temperature. This allows both the crystal blanks 2a and 3a to operate stably, thus improving the noise characteristic of the signal output from the crystal oscillator 1A.

Third Embodiment

Figure 6A:
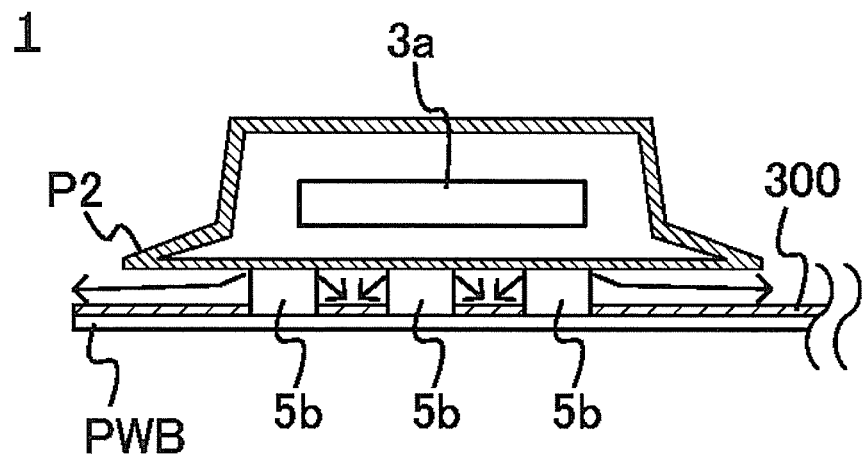
FIG. 6A is a cross-sectional view of a wiring board and a package of the crystal oscillator.
Figure 6B:
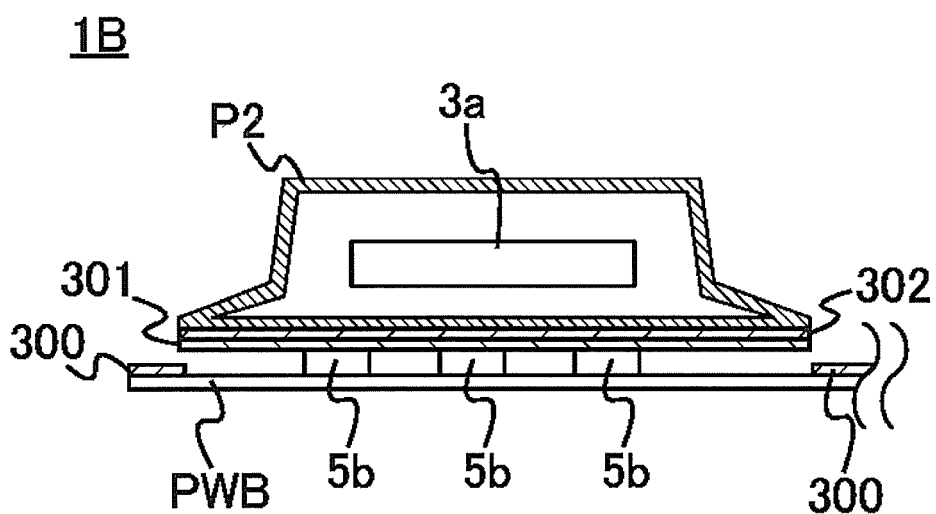
FIG. 6B is a cross-sectional view of a wiring board and a package of a crystal oscillator according to a third embodiment.

Next, a description will be given of a crystal oscillator 1B according to a third embodiment. In the crystal oscillator 1B according to the third embodiment, there is a device for further improving the transfer efficiency of the heat generated by the heat generating portions 5a to 5d compared with the first and second embodiments. Hereinafter, a description will be given of the detail of the crystal oscillator 1B according to the third embodiment with reference to FIG. 6A and FIG. 6B. Here, FIG. 6A and FIG. 6B are drawings corresponding to FIG. 4B, and illustrate cross-sectional views of the wiring board and the package P2. FIG. 6A is a cross-sectional view for comparison with the crystal oscillator 1B according to the third embodiment. FIG. 6B is a cross-sectional view of the crystal oscillator 1B according to the third embodiment. Here, while FIG. 6A and FIG. 6B only illustrate the cross-sectional views of the package P2, the same applies to the packages P1 and P3.

As illustrated in FIG. 6A, on a printed wiring board PWB, to protect the generated circuit pattern, usually, ink to be an insulating film referred to as a resist (hereinafter referred to as a resist 300) is applied over the surface. In the case where the resist 300 is applied between the package P2 and the wiring board PWB, the heat generated from the heat generating portion 5b warms the entire package P2 through the copper body of the wiring board PWB. The resist 300 becomes a resistor so as to reduce the transfer efficiency of the heat to the package P2.

Therefore, in the crystal oscillator 1B according to the third embodiment, as illustrated in FIG. 6B, the resist is peeled off in at least a part of the lower portion of the package P2 on the wiring board PWB. Here, the part where the resist is peeled off is preferred to be the entire region of the lower portion of the package P2. In this embodiment, in a rectangular region including the lower portion of the package P2, the resist is peeled off. More specifically, as illustrated in FIG. 4A and FIG. 4C, the bottom surface of the package P2 has a circular shape. Accordingly, in this embodiment, the resist is peeled off in the rectangular region circumscribed by the package P2 (circle).

In the crystal oscillator 1B according to the third embodiment, to further improve the transfer efficiency of the heat to the package P2 of the heat generating portion 5b, it is possible to dispose a thermal conductive sheet 302 on the bottom surface of the package P2 and to apply silicone 301 to cover this thermal conductive sheet 302 as illustrated in FIG. 6B. Accordingly, the heat generated from the heat generating portion 5b efficiently transfers to the package P2 (specifically, the crystal blank 3a) via the wiring board PWB.

The crystal oscillator 1B according to the third embodiment described above describe allows efficient transfer of heat generated from the heat generating portion 5b, thus allowing more stable temperature control compared with the crystal oscillators 1 and 1A according to the first and second embodiments.

This disclosure has been described above using the embodiments. However, the technical scope of this disclosure is not limited to the scope of the above-described embodiments. It is apparent that a variety of the variations or modifications of the above-described embodiments can be made by those skilled in the art. It is apparent that such variations or modifications of the embodiments can be encompassed in the technical scope of this disclosure by the claims.

Figure 7A:
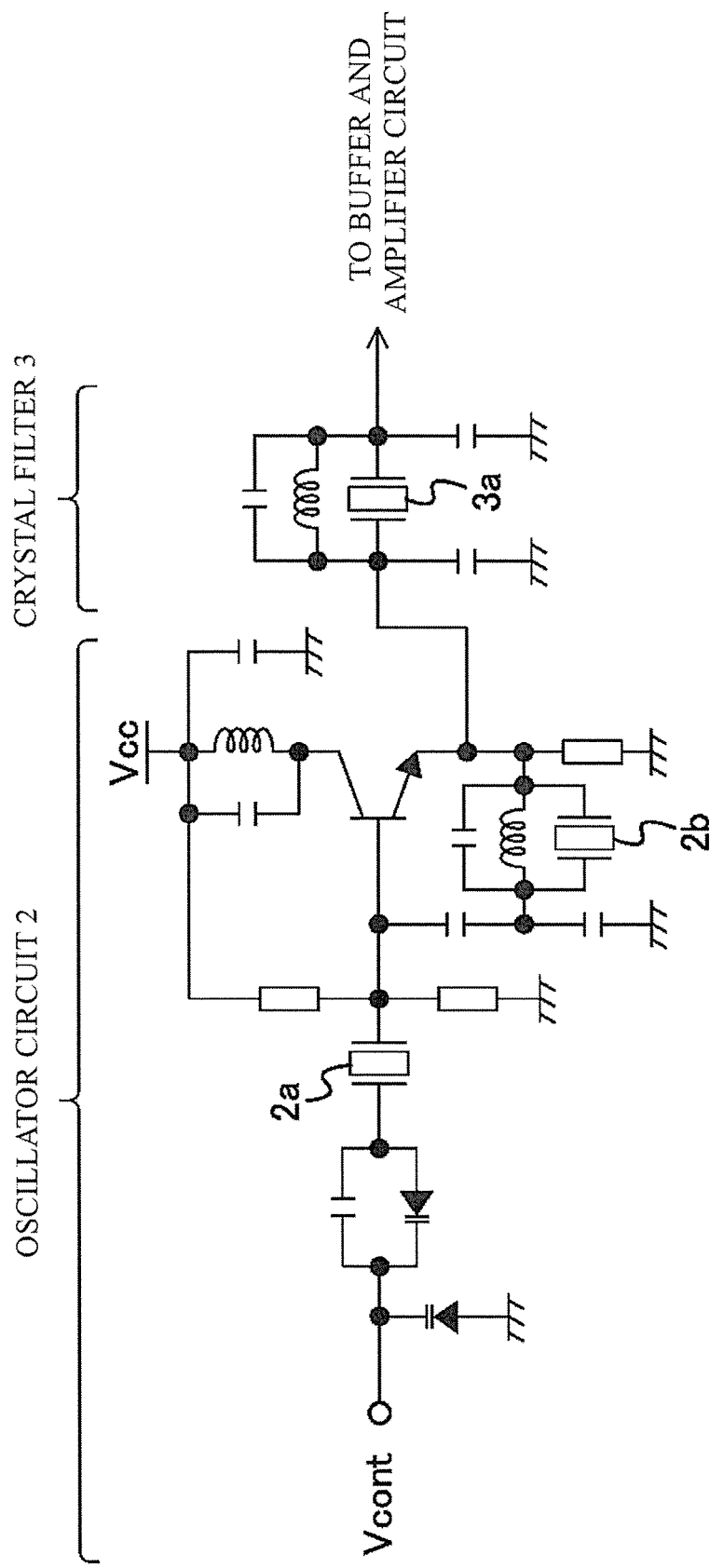
FIG. 7A is a circuit configuration diagram of an oscillator circuit with a plurality of crystal units and a crystal filter.
Figure 7B:
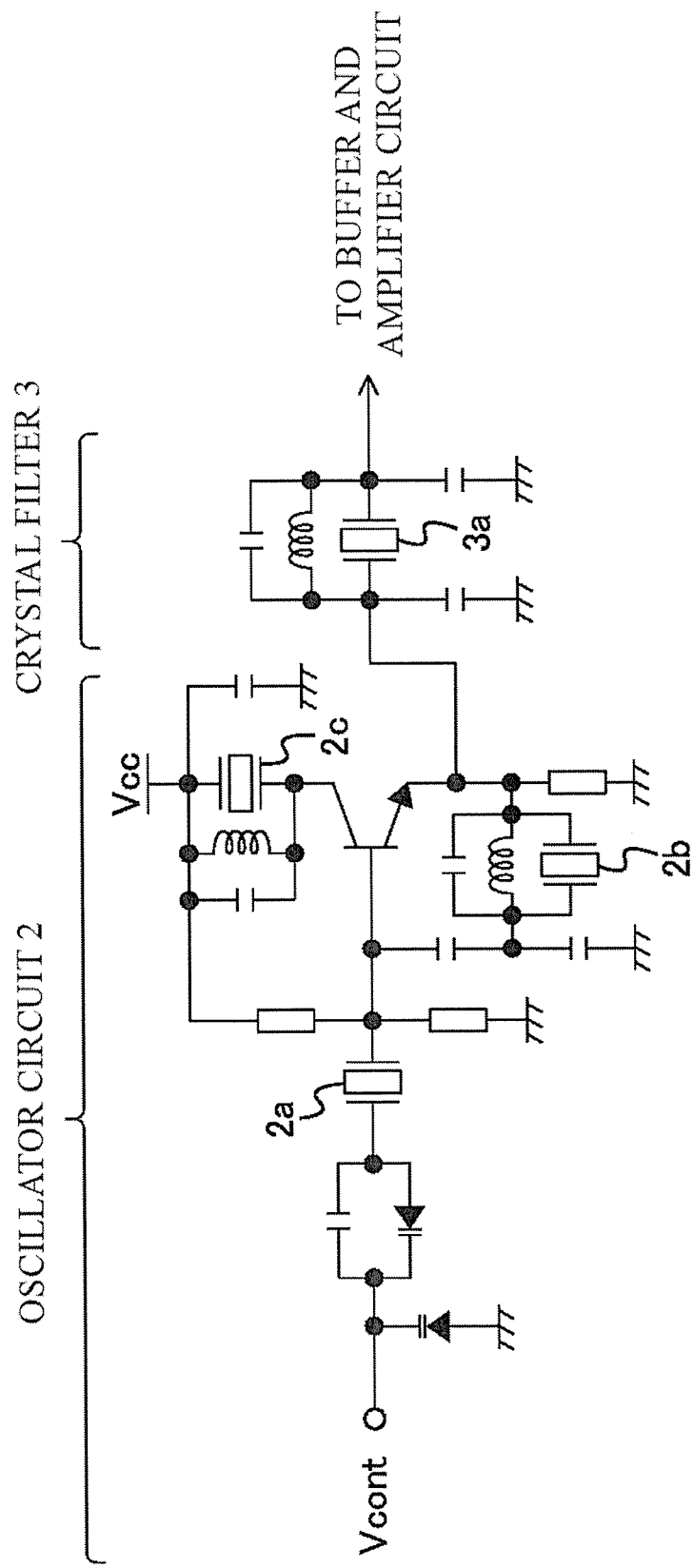
FIG. 7B is a circuit configuration diagram of an oscillator circuit with a plurality of crystal units and a crystal filter.

For example, in the above-described embodiments, one crystal blank 2a is used for one oscillator circuit 2. This should not be construed in a limiting sense. A plurality of crystal blanks may be used for one oscillator circuit 2. That is, as illustrated in FIG. 7A and FIG. 7B, the crystal blanks 2b and 2c may be used on the emitter side or/and the collector side of the transistor of the oscillator circuit 2. This allows reducing the noise of the output frequency of the oscillator circuit 2. Also in this case, covering the crystal blanks 2a, 2b, and 2c of the oscillator circuit 2 and the crystal blank 3a of the crystal filter 3 with a predetermined package to control the temperature allows reducing the influence of the temperature change in association with providing a sharp peak of the frequency characteristic. This allows improving the frequency stability and the noise characteristic of the signal output from the crystal oscillator 1.

In this case, the respective crystal blanks 2a, 2b, 2c, and 3a may be covered with individual packages, all of the crystal blanks 2a, 2b, 2c, and 3a may be covered with a package in common, and the crystal blanks 2a, 2b, 2c, and 3a may be combined in any combination to be covered for each combination.

Figure 7C:
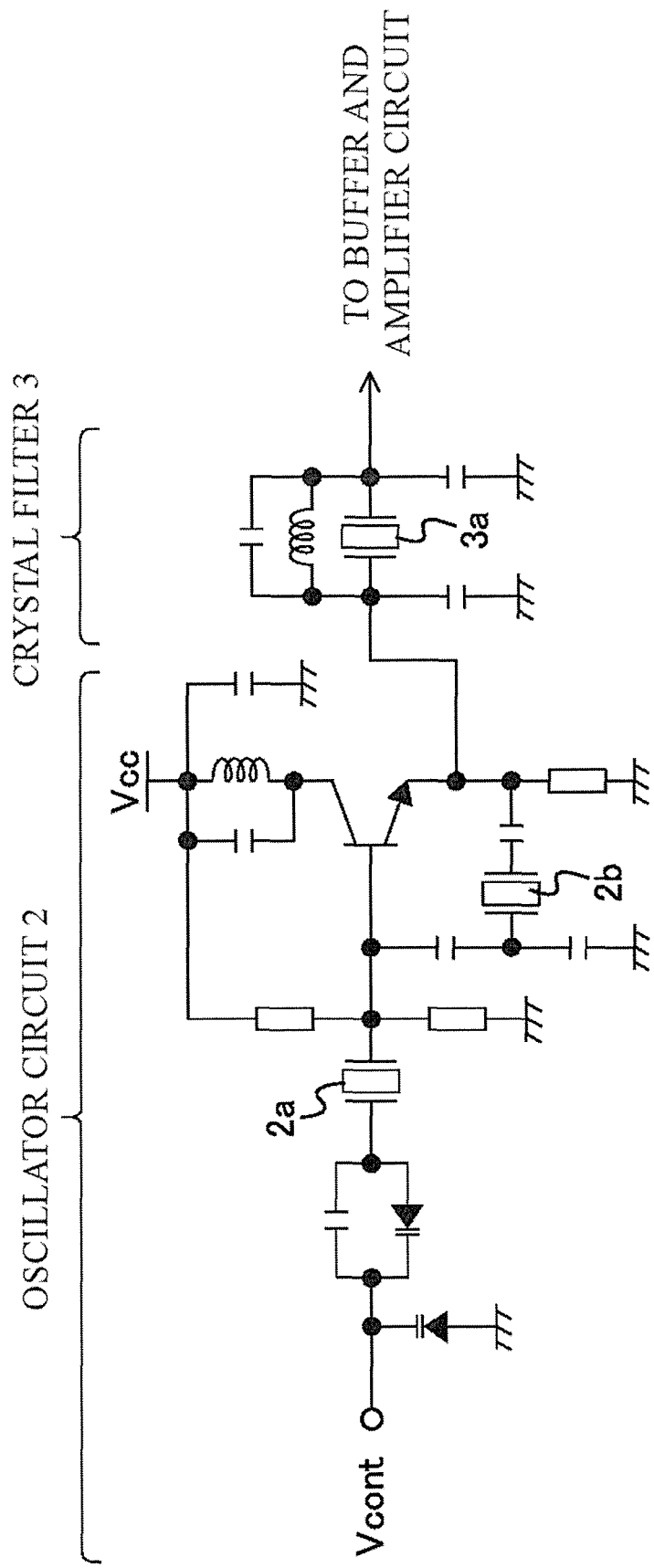
FIG. 7C is a circuit configuration diagram of an oscillator circuit with a plurality of crystal units and a crystal filter.
Figure 8:
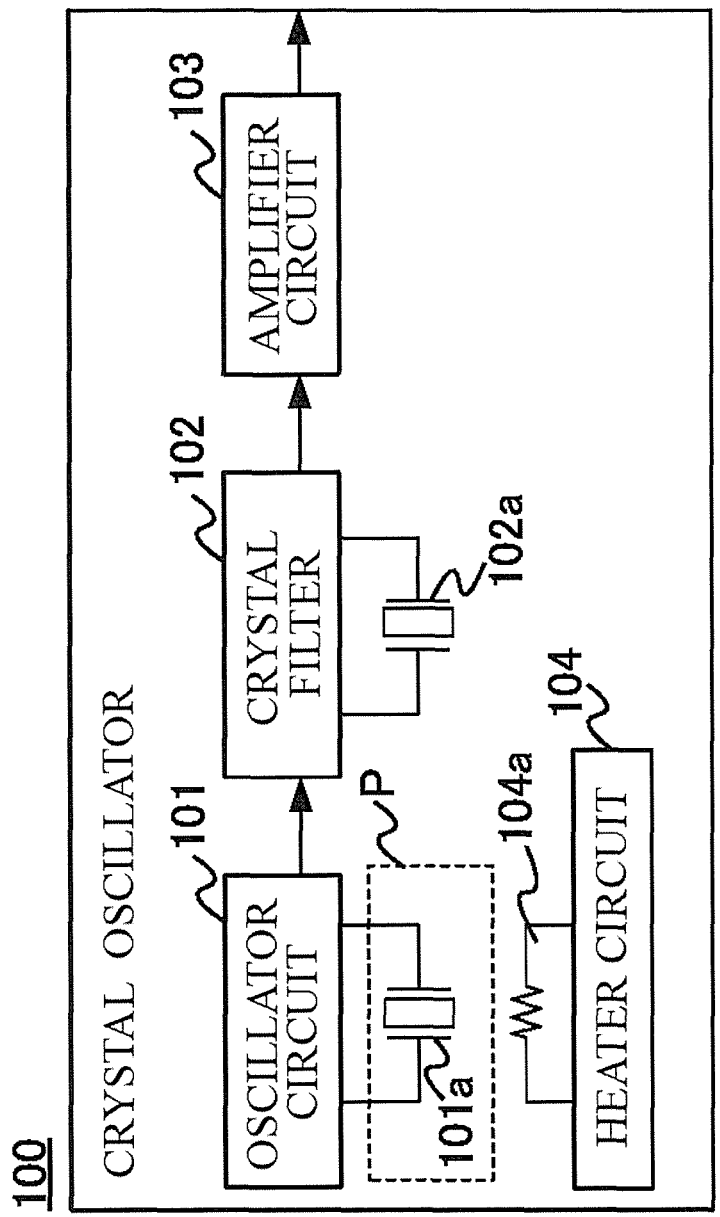
FIG. 8 is a function configuration diagram of a conventional crystal oscillator.
Figure 9:
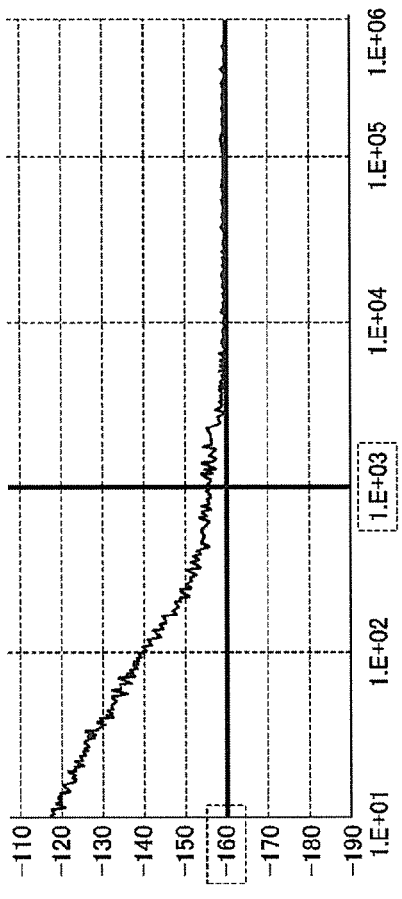
FIG. 9 is a graph illustrating comparison between a phase noise characteristic of a crystal oscillator without a crystal filter and a phase noise characteristic of a crystal oscillator with a crystal filter.
Figure 9:
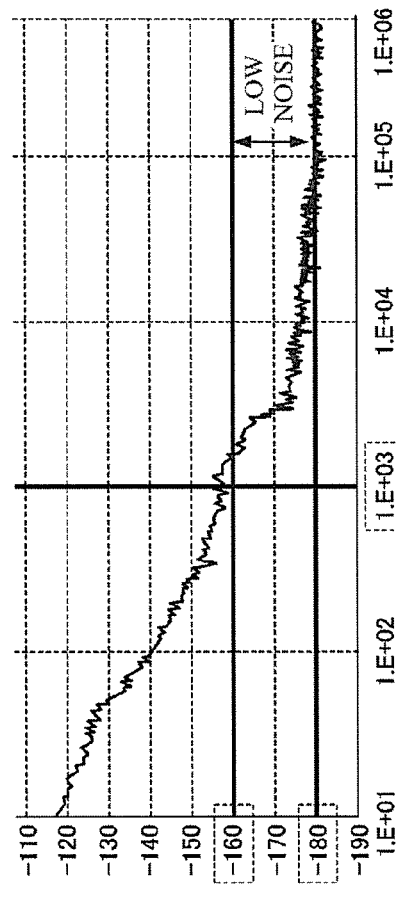
Figure 10:
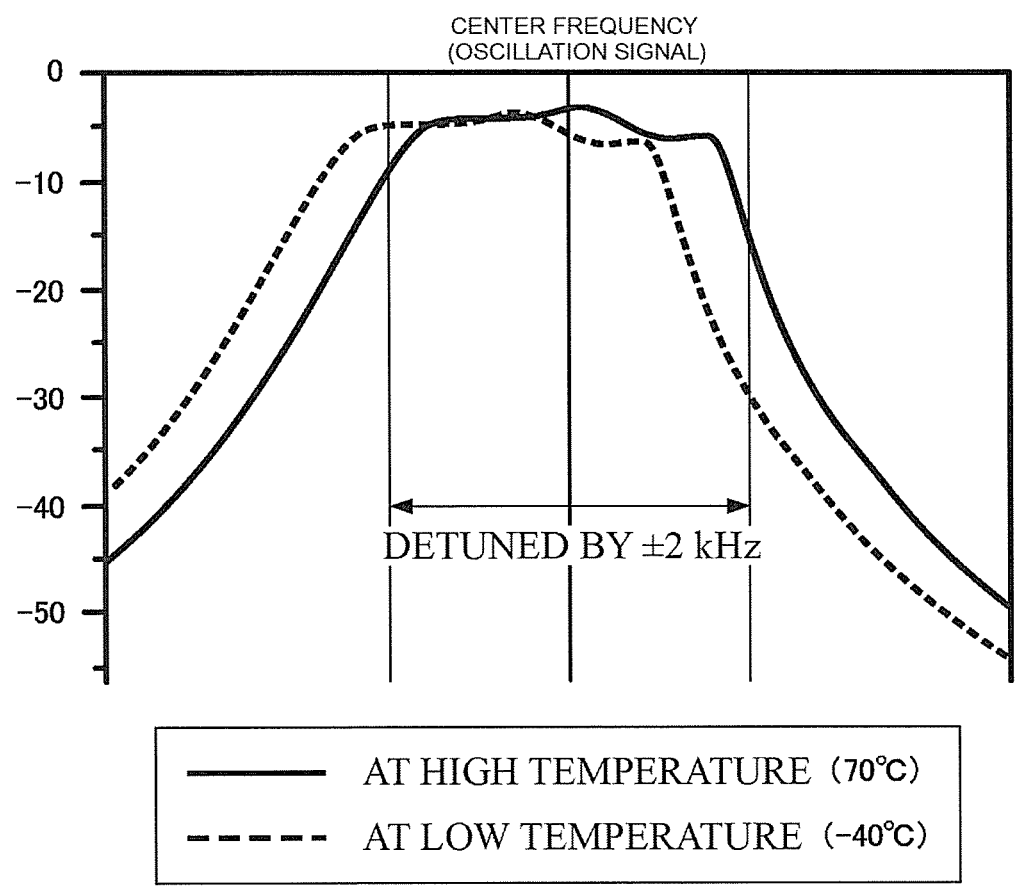
FIG. 10 is a graph illustrating temperature characteristics of the crystal filter.

Instead of the circuit configuration illustrated in FIG. 7A, the circuit configuration illustrated in FIG. 7C may be adopted.

In the above-described oscillator, the following configuration may be employed. The heating portion includes a heat generating portion and an adjustment portion. The heat generating portion is configured to generate heat. The adjustment portion is configured to control ambient temperatures of the oscillator circuit and the crystal filter corresponding to heat generation of the heat generating portion. The package portion is heated by transfer of heat generated by the heat generating portion of the heating portion.

In the above-described oscillator, the following configuration may be employed. The heating portion includes a first heat generating portion and a second heat generating portion. The first heat generating portion is configured to heat the crystal blank of the oscillator circuit. The second heat generating portion is configured to heat the crystal blank of the crystal filter. The package portion includes a first package portion and a second package portion. The first package portion covers the crystal blank of the oscillator circuit. The second package portion covers the crystal blank of the crystal filter.

In the above-described oscillator, the following configuration may be employed. The adjustment portion is configured to: control the first heat generating portion such that the ambient temperature of the oscillator circuit is within a first range from a target temperature for the oscillator circuit; and control the second heat generating portion such that the ambient temperature of the crystal filter is within a second range from a target temperature for the crystal filter. The second range is wider than the first range.

In a second aspect of this disclosure, there is provided an oscillator where the package portion covers the crystal blank of the oscillator circuit and the crystal blank of the crystal filter with one package.

In the above-described oscillator, the adjustment portion may control the heat generating portion such that the ambient temperatures of the oscillator circuit and the crystal filter are within a predetermined range from a target temperature.

In a third aspect of this disclosure, on the wiring board, a resist may be peeled off in at least a part of a lower portion of the package portion.

The above-described oscillator may include silicone applied between the package portion and the heating portion.

The above-described oscillator may include a thermal conductive sheet disposed between the package portion and the heating portion.

This disclosure allows providing an oscillator that improves the noise characteristic of a signal to be output.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An oscillator, comprising:
   an oscillator circuit, being configured to output an oscillation signal;
   a crystal filter, having a frequency characteristic where an attenuation at a detuned frequency is larger than an attenuation at an oscillation frequency of the oscillation signal, and the detuned frequency being a frequency different from the oscillation frequency;
   a package portion that covers a crystal blank of the oscillator circuit and a crystal blank of the crystal filter; and
   a heating portion, being configured to heat the crystal blank of the oscillator circuit and the crystal blank of the crystal filter by using a resistor disposed between a wiring board to which the package portion is secured, and the package portion,
   wherein the heating portion includes:
      a heat generating portion, being configured to generate heat; and
      an adjustment portion, being configured to control ambient temperatures of the oscillator circuit and the crystal filter corresponding to heat generation of the heat generating portion, wherein
   the package portion is heated by transfer of heat generated by the heat generating portion of the heating portion.

2. The oscillator according to claim 1, wherein
the heating portion includes:
   a first heat generating portion, being configured to heat the crystal blank of the oscillator circuit; and
   a second heat generating portion, being configured to heat the crystal blank of the crystal filter, and
the package portion includes:
   a first package portion that covers the crystal blank of the oscillator circuit; and
   a second package portion that covers the crystal blank of the crystal filter.

3. The oscillator according to claim 2, wherein
the adjustment portion is configured to:
   control the first heat generating portion such that the ambient temperature of the oscillator circuit is within a first range from a target temperature for the oscillator circuit; and
   control the second heat generating portion such that the ambient temperature of the crystal filter is within a second range from a target temperature for the crystal filter, and
the second range is wider than the first range.

4. The oscillator according to claim 1, wherein
the package portion covers the crystal blank of the oscillator circuit and the crystal blank of the crystal filter in one package.

5. The oscillator according to claim 4, wherein
the adjustment portion controls the heat generating portion such that the ambient temperatures of the oscillator circuit and the crystal filter are within a predetermined range from a target temperature.

6. The oscillator according to claim 1, wherein
a resist is peeled off in at least a part of a lower portion of the package portion on the wiring board.

7. The oscillator according to claim 1, further comprising:
a silicone, being applied between the package portion and the heating portion.

8. The oscillator according to claim 1, further comprising:
a thermal conductive sheet, being disposed between the package portion and the heating portion.

* * * * *